(12) United States Patent
Tsai et al.

(10) Patent No.: US 11,587,824 B2
(45) Date of Patent: *Feb. 21, 2023

(54) METHOD FOR MANUFACTURING SEMICONDUCTOR STRUCTURE

(71) Applicant: TAIWAN SEMICONDUCTOR MANUFACTURING COMPANY LIMITED, Hsin-Chu (TW)

(72) Inventors: Yu-Hsiang Tsai, Hsinchu (TW); Chung-Chuan Tseng, Hsinchu (TW); Chia-Wei Liu, Hsinchu County (TW); Li-Hsin Chu, New Taipei (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/893,810

(22) Filed: Jun. 5, 2020

(65) Prior Publication Data
US 2020/0303243 A1    Sep. 24, 2020

Related U.S. Application Data

(62) Division of application No. 15/477,869, filed on Apr. 3, 2017, now Pat. No. 10,679,889, which is a division of application No. 14/857,435, filed on Sep. 17, 2015, now Pat. No. 9,627,249.

(51) Int. Cl.
*H01L 21/762* (2006.01)
*H01L 21/324* (2006.01)
*H01L 29/06* (2006.01)
*H01L 21/78* (2006.01)
*H01L 21/84* (2006.01)

(52) U.S. Cl.
CPC ...... *H01L 21/76254* (2013.01); *H01L 21/324* (2013.01); *H01L 21/76243* (2013.01); *H01L 21/76251* (2013.01); *H01L 21/7813* (2013.01); *H01L 21/84* (2013.01); *H01L 29/0623* (2013.01)

(58) Field of Classification Search
None
See application file for complete search history.

(56) References Cited

U.S. PATENT DOCUMENTS

| | | | |
|---|---|---|---|
| 5,585,283 A * | 12/1996 | America | H01L 31/1804 438/66 |
| 10,679,889 B2 * | 6/2020 | Tsai | H01L 21/76243 |
| 2003/0159644 A1 | 8/2003 | Yonehara et al. | |
| 2004/0180512 A1 | 9/2004 | Linn et al. | |
| 2007/0232025 A1 | 10/2007 | Moriceau et al. | |
| 2009/0286393 A1 | 11/2009 | Mathew et al. | |
| 2012/0306056 A1 * | 12/2012 | Schmitt | H01L 23/585 257/620 |
| 2014/0055008 A1 | 2/2014 | Ito | |

* cited by examiner

*Primary Examiner* — Alexander G Ghyka
(74) *Attorney, Agent, or Firm* — Cooper Legal Group, LLC

(57) ABSTRACT

A method for manufacturing a semiconductor structure includes at least following steps. A device layer is formed on a first semiconductor substrate. The device layer is separated from the first semiconductor substrate. A dielectric layer is formed on a second semiconductor substrate. The device layer is bonded onto the dielectric layer.

20 Claims, 2 Drawing Sheets

METHOD FOR MANUFACTURING SEMICONDUCTOR STRUCTURE

PRIORITY CLAIM AND CROSS-REFERENCE

The present application is a divisional application of U.S. application Ser. No. 15/477,869, filed Apr. 3, 2017, which is a divisional application of U.S. application Ser. No. 14/857,435, filed Sep. 17, 2015, which is herein incorporated by reference.

BACKGROUND

The present disclosure relates to silicon on insulator (SOI) semiconductor devices.

A silicon on insulator (SOI) metal oxide semiconductor field-effect transistor (MOSFET) formed on an SOI substrate having an SOI layer has the advantages of small junction capacitance of the source/drain regions and a small substrate bias effect. This type of SOI MOSFET is receiving attention as a device with excellent high-speed performance capabilities.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
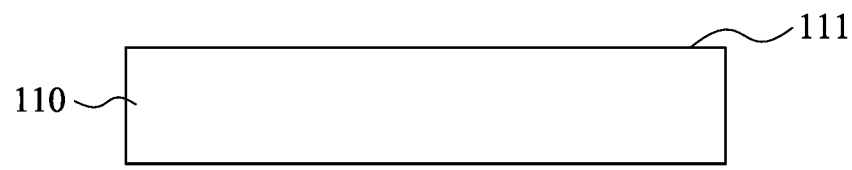
FIG. 1 to FIG. 7 are pictorial representations (through cross-sectional views) illustrating processing steps that are employed in various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A silicon-on-insulator (SOI) structure includes a silicon-containing layer, a buried oxide and a silicon-containing substrate. The buried oxide is sandwiched between the silicon-containing layer and the silicon-containing substrate and electrically isolates the silicon-containing layer and the silicon-containing substrate. It is understood that the silicon-containing layer is the SOI layer of the final wafer, and active regions can be presented in the silicon-containing layer. In other words, at least one transistor is formed on the silicon-containing layer. Since the SOI structure is a three-layered structure stacked by layers having different coefficients of thermal expansion in various embodiments, the SOI structure may suffer from undesired warpage during the process of forming the transistor on the SOI structure. More particularly, a thermal treatment for forming the transistor may induce the undesired warpage to the SOI structure since the buried oxide has a coefficient of thermal expansion different from the coefficients of thermal expansion of the silicon-containing layer and substrate. As a result, in various embodiments of the present disclosure, a SOI structure is formed after forming the device, which prevents the SOI structure from the thermal process for forming the device, thereby preventing the undesired warpage.

FIG. 1 to FIG. 7 are pictorial representations (through cross-sectional views) illustrating processing steps that are employed in various embodiments of the present disclosure. In FIG. 1, a first semiconductor substrate 110 is provided. In various embodiments, the first semiconductor substrate 110 can be a silicon-containing substrate. For example, a material of the first semiconductor substrate 110 may include, but is not limited to, silicon (Si), silicon germanium (SiGe), silicon carbide (SiC), silicon germanium carbide (SiGeC), Si/Si, Si/SiC, or Si/SiGeC.

Figure 2:
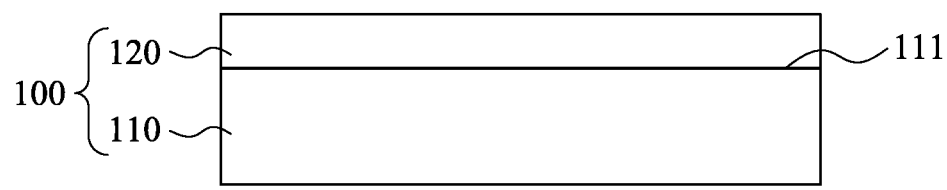

In FIG. 2, a semiconductor layer, such as an epitaxial semiconductor layer 120, is formed on the first semiconductor substrate 110. The epitaxial semiconductor layer 120 and the first semiconductor substrate 110 cooperatively form a first wafer 100. In particular, a semiconductor material such as silicon is epitaxially grown on an exposed surface 111 of the first semiconductor substrate 110 to form the epitaxial semiconductor layer 120. In various embodiments, the first semiconductor substrate 110 may be a silicon substrate or other crystalline semiconductor substrate which benefits epitaxial growth. In various embodiments, some exemplary methods of epitaxial growth process includes heating the first semiconductor substrate 110 to between about 1050° C. and about 1200° C. in a reaction vessel; purging the HCl gas from a reaction vessel; and reacting dichlorosilane and hydrogen gas in the reactor furnace to grow the epitaxial layer at a growth rate of at least 5 μm/minute to be the epitaxial semiconductor layer 120. In various embodiments, trichlorosilane, tetrachlorosilane, or a number of other silane-based gases may optionally be used in place of dichlorosilane. In various embodiments, some exemplary methods of epitaxial growth process may include a deposition process, such as such as chemical vapor deposition (CVD), atomic layer deposition (ALD) or any other suitable process. The chemical vapor deposition is a deposition process in which a deposited species is formed as a result of chemical reaction between gaseous reactants at greater than room temperature; wherein solid product of the reaction is deposited on the surface on which a film, coating, or layer of the solid product is to be formed. Variations of CVD processes include, but not limited to, atmospheric pressure CVD (APCVD), low pressure CVD (LPCVD) and plasma enhanced CVD (EPCVD), metal-organic CVD (MOCVD) and combinations thereof may also be employed.

In various embodiments, the epitaxial semiconductor layer 120 may include the same material as the first semiconductor substrate 110 and has the same crystallographic orientation as the first semiconductor substrate 110. In various embodiments, the epitaxial semiconductor layer 120 may include the material different from the first semiconductor substrate 110 and has the crystallographic orientation different from the first semiconductor substrate 110. In various embodiments, a material of the epitaxial semiconductor layer 120 may include, but is not limited to, silicon (Si), silicon germanium (SiGe), silicon carbide (SiC), silicon germanium carbide (SiGeC), Si/Si, Si/SiC, and Si/SiGeC.

Figure 3:
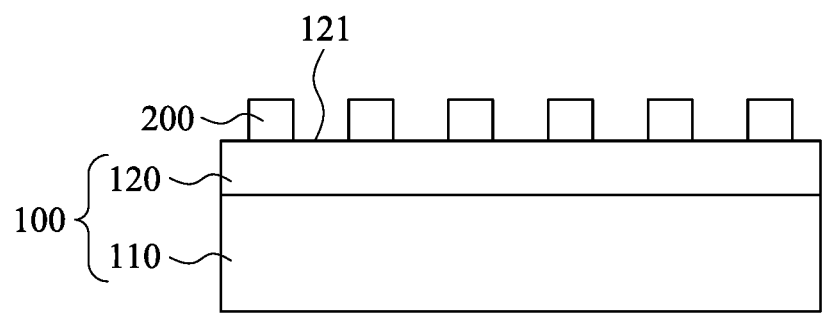

In FIG. 3, a device 200 is formed on the first wafer 100. In particular, the device 200, such as a transistor, may be formed on a surface of the epitaxial semiconductor layer 120 opposite to the first semiconductor substrate 110. The epitaxial semiconductor layer 120 and the device 200 cooperatively form a device layer. More particularly, the epitaxial semiconductor layer 120 has an exposed surface 121 that is located away from the first semiconductor substrate 110. In other words, the exposed surface 121 and the first semiconductor substrate 110 are respectively located on opposite sides of the epitaxial semiconductor layer 120. Stated differently, the epitaxial semiconductor layer 120 has the exposed surface 121 opposite to the first semiconductor substrate 110. The device 200 is formed on the exposed surface 121 of the epitaxial semiconductor layer 120, so that the device 200 and the epitaxial semiconductor layer 120 cooperatively form the device layer, which is removable from the first semiconductor substrate 110 in a later process.

In various embodiments, the process for forming the device layer includes at least one thermal process. More particularly, the process for forming the device 200 includes at least one thermal process. In other words, during the process of forming the device 200, a thermal process or thermal treatment may be performed, and the temperature of the first wafer 100 may be raised during the thermal process or thermal treatment. In various embodiments, warpage of the first wafer 100 during the thermal process may be alleviated because the difference between coefficients of thermal expansion of adjacent layers of the first wafer 100 is low. For example, the first semiconductor substrate 110 and the epitaxial semiconductor layer 120 may include semiconductor materials, and the epitaxial semiconductor layer 120 may be stacked on the first semiconductor substrate 110 without an intermediate oxide or other dielectric materials therebetween in various embodiments, and therefore, the difference between coefficients of thermal expansion of adjacent layers of the first wafer 100 can be lowered, which reduces warpage of the first wafer 100 during the thermal process.

Stated differently, when the temperature of the first wafer 100 is raised to benefit the manufacturing process of the device 200, the first wafer 100 may deform or warp acceptably, which benefits the device 200 to be formed in an acceptable overlay accuracy. In various embodiments, the device 200 is a logic device that is manufactured by logic processes, and one of the logic processes may be performed in high temperature, and the first wafer 100 can be kept in an acceptable deformation or warpage during the high-temperature logic process.

Figure 4:
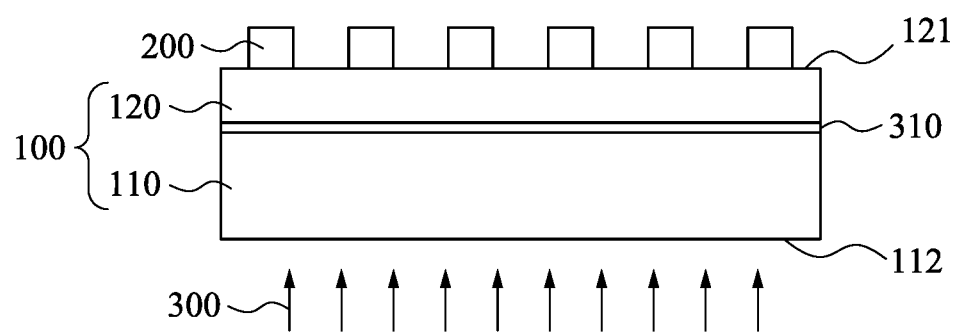
Figure 5:
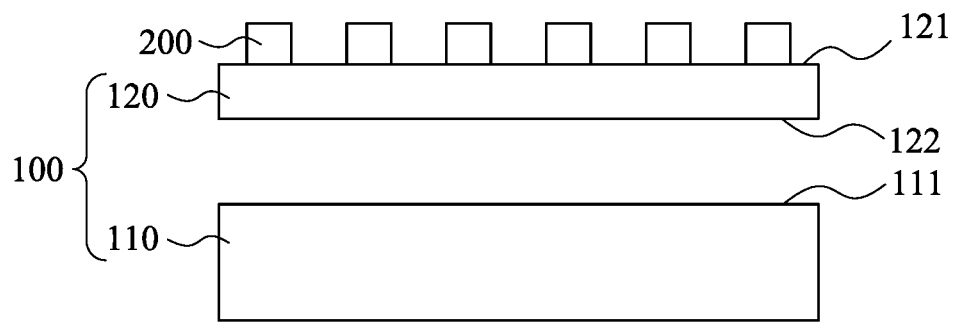

Reference can be now made to FIGS. 4 and 5. A portion of the first wafer 100 with the device 200 thereon is separated from the remaining first wafer 100. In other words, the device layer (including the epitaxial semiconductor layer 120 and the device 200 thereon) is separated from the first semiconductor substrate 110. The separation process may benefit forming an SOI structure under the device 200. During the process of forming the SOI structure, the device 200 has already formed, and therefore, the thermal process for forming the device 200 does not influence the post-formed SOI structure. More particularly, the thermal process for forming the device 200 may not induce undesired or unacceptable warpage of the SOI structure.

In various embodiments, the first wafer 100 can be separated by ion implantation and thermal treatment. The term of "ion implantation" is a physical process in which atoms are ionized and isolated, accelerated, formed into a beam and targeted onto the first wafer 100. The ions penetrate into the first wafer 100 and rest at a desired depth. The desired depth can be controlled by certain parameters to define where cleavage occurs. In FIG. 4, at least one impurity 300 is implanted into the first wafer 100 to form a buried layer 310 therein. More particularly, the impurities 300 are implanted into an interface between the device layer (including the epitaxial semiconductor layer 120 and the device 200 thereon) and the first semiconductor substrate 110 to form the buried layer 310 between the device layer and the first semiconductor substrate 110. For example, in various embodiments, the impurity 300 may be hydrogen. In particular, hydrogen ions may be implanted into first wafer 100 to form the buried layer 310 between the first semiconductor substrate 110 and the epitaxial semiconductor layer 120. The buried layer 310 may form a weakened plane, which benefits separating the epitaxial semiconductor layer 120 from the first semiconductor substrate 110. More particularly, within the weakened plane, the implanted hydrogen ions may create damaged atomic bonds in the semiconductor crystal lattice, rendering the first wafer 100 susceptible to separation along the weakened plane, as will be exploited later in the fabrication sequence described further below. The implantation energy can be controlled to define the weakened plane at the desired depth. In various embodiments, other implanted species may be used. For example, the impurity may include helium. More particularly, helium ions may be implanted into the first wafer 100. In various embodiments, the impurities may include, but are not limited to, hydrogen and helium. More particularly, hydrogen ions and helium ions may be implanted into the first wafer 100 during the ion implantation process.

In various embodiments, as shown in FIG. 4, the first semiconductor substrate 110 includes a back surface 112 opposite to the epitaxial semiconductor layer 120. In other words, the back surface 112 is located away from the epitaxial semiconductor layer 120. In other words, the back surface 112 and the epitaxial semiconductor layer 120 are respectively located on opposite sides of the first semiconductor substrate 110. In various embodiments, bombardment of the ions (impurities 300) may take place through the back surface 112 into the first wafer 100. In other words, the ions (impurities 300) are targeted onto the back surface 112 of the first wafer 100. Stated differently, the ions (impurities 300) are implanted into the first wafer 100 through the back surface 112 to form the buried layer 310 between the first semiconductor substrate 110 and the epitaxial semiconductor layer 120. By such a way, ion bombardment may not influence the device 200 on the exposed surface 121 of the epitaxial semiconductor layer 120.

After the ion implantation process, the first wafer 100 is heated to separate the first wafer 100 along the buried layer 310. In particular, the device layer (including the epitaxial semiconductor layer 120 and the device 200 thereon) is separated from the first semiconductor substrate 110 along the buried layer 310 by heating the device layer and the first semiconductor substrate 110. More particularly, the implanted ions (impurities 300) in the buried layer 310 are heated to produce gas, and the first semiconductor substrate 110 and the epitaxial semiconductor layer 120 may be separated by the gas produced by the ions, as shown in FIG. 5. In various embodiments, the thermal treatment benefiting cleavage of the first wafer 100 may be, but is not limited to, an anneal process. In this separation process, the ions (impurities 300) can be employed as an atomic scalpel that cuts through the buried layer 310 between the first semiconductor substrate 110 and the epitaxial semiconductor layer 120 during the thermal treatment. The specific separation process may be exemplarily described as follows.

In various embodiments, when the impurity 300 is hydrogen, hydrogen plays many roles in this separation process. First, hydrogen implantation produces damage that is concentrated within the buried layer 310 between the first semiconductor substrate 110 and the epitaxial semiconductor layer 120. The damage zone includes various defects, such as voids, platelets or microcavities. Second, after hydrogen implantation but before any thermal treatment, a large fraction of hydrogen is chemically bound to the semiconductor material at the internal surfaces of the defects within the buried layer 310 between the first semiconductor substrate 110 and the epitaxial semiconductor layer 120, and it passivates internal surfaces of these defects. This passivation effect may prevent healing of microcracks during the early phase of thermal annealing. In addition to hydrogen atoms that are tied to the semiconductor material, some molecular hydrogen gas fills the defects. Hydrogen that is bonded to the semiconductor material, such as silicon, starts decreasing at a particular temperature, such as about 150° C., while the total concentration remains constant until a temperature about >400° C. is reached. This may be interpreted as an increase in molecular hydrogen gas ($H_2$) being released into the defects, which leads to a pressure buildup. The pressure of molecular hydrogen gas in the defects may cause microcracks. These microcracks provide the weakend plane within the buried layer 310 that can be cleaved by the application of a mechanical stress, or the micocracks can be further propagated by heating to the point where these microcracks can split the epitaxial semiconductor layer 120 from the first semiconductor substrate 110. By such a heat treatment, the epitaxial semiconductor layer 120 and the first semiconductor substrate 110 can be separated.

In various embodiments, as shown in FIG. 5, after the first wafer 100 is cleaved, a cleaved surface 122 of the epitaxial semiconductor layer 120 is formed. In various embodiments, the cleaved surface 122 may be rougher than the exposed surface 121 on which the device 200 is disposed based on at least following reasons. In various embodiments, cleavage occurs on the cleaved surface 122, which may make the cleaved surface 122 rough due to remainders of defects produced by the ion implantation. In various embodiments, the exposed surface 121 of the epitaxial semiconductor layer 120 can be planarized so as to benefit the manufacturing process of the device 200. An exemplary method to planarize the exposed surface 121 may be, but is not limited to, chemical-mechanical polishing (CMP). As such, the cleaved surface 122 may be rougher than the exposed surface 121 on which the device 200 is disposed. In other words, roughness of the cleaved surface 122 is higher than roughness of the exposed surface 121.

In various embodiments, as shown in FIG. 5, the cleaved surface 122 may be at least partially bonded with hydrogen because during the cleaving process, some hydrogen may be chemically bond to the material of the first wafer 100 when employing hydrogen ions for ion implantation. In various embodiments, the cleaved surface 122 may be at least partially bonded with helium because during the cleaving process, some helium may be chemically bond to the material of the first wafer 100 when employing helium ions for ion implantation. In various embodiments, the cleaved surface 122 may be at least partially bonded with hydrogen and helium because during the cleaving process, some hydrogen and helium may be chemically bond to the material of the first wafer 100 when employing hydrogen ions and helium ions for ion implantation.

Figure 6:
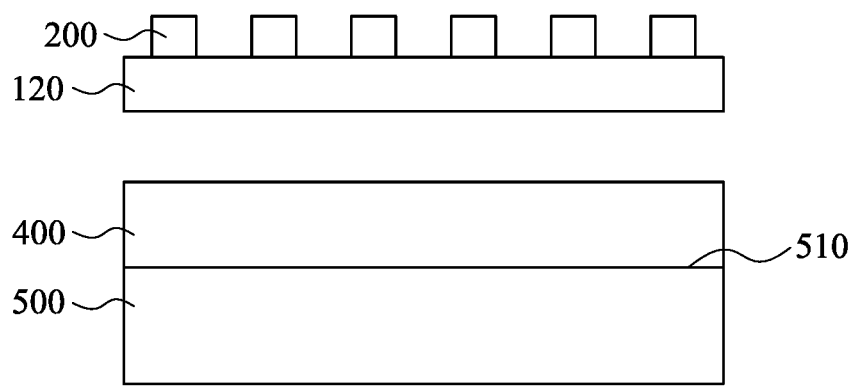

In FIG. 6, a dielectric layer 400 is formed on a second semiconductor substrate 500. In particular, the dielectric layer 400 can be formed on an exposed surface 510 of the second semiconductor substrate 500. More particularly, the dielectric layer 400 can be grown on the exposed surface 510 of the second semiconductor substrate 500. In various embodiments, the dielectric layer 400 may be an oxide layer. For example, when the material of the second semiconductor substrate 500 is silicon, an oxidation process, such as the wet oxidation process or the dry oxidation process, may be performed on the exposed surface 510 of the second semiconductor substrate 500, so that a layer of silicon oxide ($SiO_2$) can be formed on the exposed surface 510 of the second semiconductor substrate 500 to be the dielectric layer 400. In various embodiments, the dielectric layer 400 can be formed by a deposition process, such as chemical vapor deposition (CVD), atomic layer deposition (ALD) or any other suitable process, to deposit a dielectric material onto the exposed surface 510 of the second semiconductor substrate 500. Variations of CVD processes which may be employed to deposit the dielectric material include, but not limited to, atmospheric pressure CVD (APCVD), low pressure CVD (LPCVD) and plasma enhanced CVD (EPCVD), metal-organic CVD (MOCVD) and combinations thereof. The deposited dielectric material may be, but is not limited to, silicon oxide ($SiO_2$) or silicon nitride (SiN).

In various embodiments, the second semiconductor substrate 500 is a second wafer that is different from the remaining first wafer 100, i.e. the first semiconductor substrate 110, as shown in FIG. 5. In other words, the second wafer on which the dielectric layer 400 is formed and the remaining first wafer 100 are different wafers in various embodiments. In various embodiments, the second semiconductor substrate 500 is the remaining first wafer 100, i.e. the first semiconductor substrate 110, as shown in FIG. 5. In other words, the remaining first wafer 100 and the second wafer on which the dielectric layer 400 is formed are the same wafer in various embodiments. Stated differently, the dielectric layer 400 may be formed on the first semiconductor substrate 110 after the first semiconductor substrate 110 is separated from the epitaxial semiconductor layer 120, which may benefit saving cost of employing an additional second semiconductor substrate 500.

In various embodiments, as shown in FIG. 6, the dielectric layer 400 is in contact with the second semiconductor substrate 500 because the dielectric layer 400 is formed on the second semiconductor substrate 500. In other words, no adhesive is located between the second semiconductor substrate 500 and the dielectric layer 400 in various embodiments.

Figure 7:
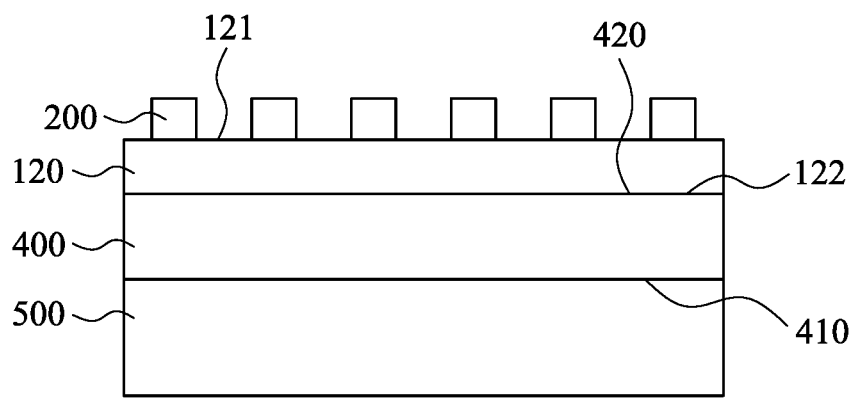

In FIG. 7, the device layer (including the epitaxial semiconductor layer 120 and the device 200 thereon) is bonded to the dielectric layer 400. In other words, the separated portion of the first wafer 100 separated in the step shown in FIG. 5 is bonded to the dielectric layer 400. By such a bonding process, the epitaxial semiconductor layer 120, the dielectric layer 400 and the second semiconductor substrate 500 can be stacked sequentially as an SOI structure. In other words, the dielectric layer 400 is buried beneath the device layer after the device layer is bonded to the dielectric layer 400. Stated differently, the dielectric layer 400 is disposed on the second semiconductor substrate 500, and the epitaxial semiconductor layer 120 is disposed on the dielectric layer 400. In particular, the dielectric layer 400 is bonded to the cleaved surface 122 located away from the device 200. The second semiconductor substrate 500 and epitaxial semiconductor layer 120 are respectively located on opposite sides of the dielectric layer 400. More particularly, the dielectric layer 400 includes a bottom surface 410 and a top surface 420. The bottom surface 410 and the top surface 420 are opposite. The bottom surface 410 of the dielectric layer 400 is in contact with the second semiconductor substrate 500, and the top surface 420 of the dielectric layer 400 is bonded to the cleaved surface 122 of the epitaxial semiconductor layer 120.

In various embodiments, the bonding process is a direct bonding process. In other words, the device layer (including the epitaxial semiconductor layer 120 and the device 200 thereon) is directly bonded onto the dielectric layer 400. Stated differently, the bonding is performed without an additional intermediate layer between the separated portion of the first wafer 100 separated in the step shown in FIG. 5 (including the epitaxial semiconductor layer 120 and the device 200 thereon) and the dielectric layer 400. More particularly, the epitaxial semiconductor layer 120 is directly bonded to the dielectric layer 400. As such, in various embodiments, the dielectric layer 400 may be in contact with the epitaxial semiconductor layer 120, and an additional intermediate layer is absent between the cleaved surface 122 of the epitaxial semiconductor layer 120 and the dielectric layer 400. More particularly, the top surface 420 of the dielectric layer 400 may be in contact with the cleaved surface 122 of the epitaxial semiconductor layer 120, and no intermediate layer is located therebetween.

In various embodiments, the epitaxial semiconductor layer 120 may be bonded to the dielectric layer 400 by an adhesive material or an electrostatic pressure. In various embodiments, the bonding process may include, but is not limited to, an initial van der Waals force bonding process, a thermocompression bonding process and a permanent bonding anneal process. A specific bonding process is exemplary described as follows.

The top surface 420 of the dielectric layer 400 may undergo an activation treatment, for example plasma activation in nitrogen under partial vacuum, and the top surface 420 may be then cleaned using, for example, an aqueous megasonics cleaning technique. After activation and cleaning processes, the top surface 420 of the dielectric layer 400 and the cleaved surface 122 of the epitaxial semiconductor layer 120 are aligned. Then, an initial room temperature bonding process may be performed, so as to form an initial van der Waals force bond between the top surface 420 of the dielectric layer 400 and the cleaved surface 122 of the epitaxial semiconductor layer 120. After initial van der Waals force bonding, the dielectric layer 400 and the epitaxial semiconductor layer 120 may undergo a thermocompression bonding process. The thermocompression bonding process enhances the initial van der Waals wafer-wafer bond prior to the final permanent anneal bonding process. After the thermocompression bonding process, the dielectric layer 400 and the epitaxial semiconductor layer 120 may undergo a final permanent anneal bonding process. In various embodiments, the permanent anneal bonding process may occur at low temperature and/or short duration because the thermocompression process may provide an enhanced van der Waals bond. The low temperature and short duration may alleviate deformation or warpage of the SOI structure. It is understood that, in various embodiments, the permanent anneal bonding process perhaps induces warpage to the SOI structure, but the overlay accuracy of the device 200 may not be affected because the device 200 has already been formed before the warpage occurs.

According to various embodiments, a method for manufacturing a semiconductor structure includes forming a device layer on a first semiconductor substrate. The device layer is separated from the first semiconductor substrate. The dielectric layer is formed on a second semiconductor substrate. The device layer is bonded onto the dielectric layer.

According to various embodiments, a method for manufacturing a semiconductor structure includes forming at least one device on a first wafer. A portion of the first wafer with the device thereon is separated from the remaining first wafer. A dielectric layer is formed on a second wafer. The separated portion of the first wafer is bonded onto the dielectric layer.

According to various embodiments, a method for manufacturing a semiconductor structure includes forming a semiconductor device on a top layer of a first substrate, removing a bottom layer of the first substrate from the top layer and bonding the top layer to a dielectric layer over a second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
    forming at least one device on a front surface of a first wafer;
    implanting at least one impurity through a back surface of the first wafer opposite the front surface of the first wafer after the forming at least one device;
    separating a first portion of the first wafer with the at least one device thereon from a remaining portion of the first wafer after the implanting;
    forming a dielectric layer on the remaining portion of the first wafer after the separating, wherein the forming a dielectric layer comprises oxidizing at least some of the remaining portion of the first wafer; and
    bonding the first portion of the first wafer onto the dielectric layer.

2. The method of claim 1, wherein:
    the at least one impurity forms a buried layer in the first wafer, and
    the separating comprises heating the first wafer to separate the first wafer along the buried layer.

3. The method of claim 1, wherein the bonding is performed without an additional intermediate layer between the first portion of the first wafer and the dielectric layer.

4. The method of claim 1, wherein the forming at least one device comprises at least one thermal process.

5. The method of claim 1, wherein the first wafer comprises a first semiconductor substrate and an epitaxial semiconductor layer over the first semiconductor substrate.

6. The method of claim 5, wherein the implanting comprises implanting the at least one impurity through a back surface of the first semiconductor substrate to define a buried layer at an interface of the first semiconductor substrate and the epitaxial semiconductor layer.

7. The method of claim 1, wherein the at least one impurity comprises at least one of hydrogen or helium.

8. A method for manufacturing a semiconductor structure, the method comprising:
    forming a semiconductor device on a top layer of a first substrate;
    implanting at least one impurity into the first substrate at an interface between a bottommost surface of the top layer of the first substrate and a topmost surface of a bottom layer of the first substrate in contact with the top layer of the first substrate through a bottommost surface of the bottom layer of the first substrate after the forming a semiconductor device, wherein the bottommost surface of the top layer has a different composition than the topmost surface of the bottom layer;
    separating the bottom layer of the first substrate from the top layer of the first substrate at the interface after the implanting; and
    bonding the top layer of the first substrate to a dielectric layer over a second substrate.

9. The method of claim 8, wherein the separating comprises:
    performing a thermal treatment to the at least one impurity to produce gas in the first substrate.

10. The method of claim 8, wherein the at least one impurity comprises at least one of hydrogen or helium.

11. The method of claim 8, wherein the top layer of the first substrate comprises an epitaxial semiconductor layer.

12. The method of claim 8, wherein the implanting comprises implanting the at least one impurity through the bottommost surface of the bottom layer of the first substrate to define a buried layer at the interface.

13. A method for manufacturing a semiconductor structure, the method comprising:
    forming a device on a first surface of a first wafer,
    implanting at least one impurity through a back surface of the first wafer to a depth of an interface at which a bottommost surface of a first layer of the first wafer contacts a topmost surface of a second layer of the first wafer, wherein:
        the back surface is diametrically opposite the first surface,
        the bottommost surface of the first layer has a different composition than the topmost surface of the second layer, and
        the implanting is performing after the forming a device;
    separating the first layer from the second layer at the interface after the implanting, wherein the bottommost surface of the first layer opposite the first surface is exposed after the separating; and
    bonding the bottommost surface of the first layer onto a dielectric layer after the separating.

14. The method of claim 13, comprising:
    forming the dielectric layer on the second layer of the first wafer after the separating.

15. The method of claim 14, wherein the forming the dielectric layer comprises oxidizing at least some of the second layer of the first wafer after the separating.

16. The method of claim 13, comprising:
    forming the dielectric layer on a second substrate prior to the bonding.

17. The method of claim 1, wherein the at least one impurity comprises helium.

18. The method of claim 1, wherein the implanting comprises implanting the at least one impurity at an interface where a material composition of the first wafer changes.

19. The method of claim 1, wherein the oxidizing comprises oxidizing less than all of the remaining portion of the first wafer.

20. The method of claim 8, wherein the second substrate is the bottom layer of the first substrate.

* * * * *